(12) United States Patent
Veltkamp

(10) Patent No.: US 11,638,344 B1
(45) Date of Patent: Apr. 25, 2023

(54) EMBEDDED ELECTRONIC HEATER CONTROLLER

(71) Applicant: Rockwell Collins, Inc., Cedar Rapids, IA (US)

(72) Inventor: Amos Veltkamp, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 447 days.

(21) Appl. No.: 16/829,199

(22) Filed: Mar. 25, 2020

(51) Int. Cl.
| | | |
|---|---|---|
| *H05K 1/02* | (2006.01) |
| *H05B 1/02* | (2006.01) |
| *B64D 15/12* | (2006.01) |
| *G01K 7/24* | (2006.01) |

(52) U.S. Cl.
CPC ............ *H05K 1/0212* (2013.01); *B64D 15/12* (2013.01); *G01K 7/24* (2013.01); *H05B 1/023* (2013.01)

(58) Field of Classification Search
CPC ............................. H05K 1/0212; H05B 1/0294
See application file for complete search history.

(56) References Cited

U.S. PATENT DOCUMENTS

| | | | |
|---|---|---|---|
| 5,010,233 A | 4/1991 | Henchen et al. | |
| 5,420,397 A * | 5/1995 | Weiss ................ | G05D 23/2401 219/508 |
| 5,896,259 A * | 4/1999 | Farwell ................ | H05K 1/0212 219/209 |
| 5,948,297 A | 9/1999 | Haubner et al. | |
| 6,114,674 A * | 9/2000 | Baugh ................ | H05B 3/265 174/250 |
| 6,621,055 B2 * | 9/2003 | Weber ................ | H05B 1/0294 219/544 |
| 6,904,799 B2 | 6/2005 | Cohen et al. | |
| 7,079,972 B1 * | 7/2006 | Wood ................ | H05K 1/0212 324/763.02 |
| 7,353,765 B1 | 4/2008 | Feldman et al. | |
| 8,086,358 B2 * | 12/2011 | O'Neil ................ | G06F 1/206 347/17 |
| 8,742,301 B2 | 6/2014 | Katayama | |

(Continued)

FOREIGN PATENT DOCUMENTS

| | | |
|---|---|---|
| CN | 104380837 B | 11/2016 |
| EP | 1164285 B1 | 12/2003 |

(Continued)

*Primary Examiner* — Dana Ross
*Assistant Examiner* — Lawrence H Samuels
(74) *Attorney, Agent, or Firm* — Suiter Swantz pc llo

(57) ABSTRACT

A circuit board is disclosed that has a pre-warming function. The circuit board includes a substrate and one or more conductive paths embedded in the substrate. The one or more electrically conductive paths include a logic control circuit containing a heating element and a temperature-sensitive element configured to control the heating element and deliver an input when the temperature-sensitive element has reached a threshold temperature. The one or more electrically conductive paths further includes a heater power circuit configured to deliver power to the logic control circuit. The one or more electrically conductive paths further includes an operational power circuit configured to switch off power to the heater power circuit and switch on power to the operational power circuit upon a delivery of the input from the logic control circuit.

11 Claims, 4 Drawing Sheets

(56) References Cited

U.S. PATENT DOCUMENTS

| | | | | |
|---|---|---|---|---|
| 8,981,259 B2* | 3/2015 | Chou | ................... | H05B 1/02 |
| | | | | 219/544 |
| 9,693,446 B2 | 6/2017 | Ragg | | |
| 2002/0162829 A1* | 11/2002 | Weber | ................... | H05B 3/26 |
| | | | | 219/209 |
| 2010/0018962 A1 | 1/2010 | Kabasin et al. | | |
| 2010/0051604 A1* | 3/2010 | Davidov | ................... | H05B 3/34 |
| | | | | 219/488 |

FOREIGN PATENT DOCUMENTS

| | | | |
|---|---|---|---|
| EP | 3133348 | B1 | 1/2020 |
| WO | 9302266 | A1 | 2/1993 |

* cited by examiner

EMBEDDED ELECTRONIC HEATER CONTROLLER

BACKGROUND

Many electronic components are rated to work within a specified temperature range. For example, industrial grade field programmable gate arrays (FPGAs) are often rated to work at temperatures down to −40° C. Electronics for military operations are generally rated to work at temperatures down to −55° C. Aircraft designed to fly at high altitudes, or equipment operating in polar regions, may easily encounter temperatures colder than −40° C., putting the equipment and the personnel at risk. Therefore, it would be advantageous to provide a solution that cures the shortcomings described above.

SUMMARY

A circuit board is disclosed. In one or more embodiments, the circuit board includes a substrate. In one or more embodiments, the circuit board further includes one or more electrically conductive paths embedded in the substrate. In one or more embodiments, the one or more electrically conductive paths includes a logic control circuit. In one or more embodiments, the logic control circuit includes a heating element configured to heat a portion of the circuit board. In one or more embodiments, the logic control circuit further includes a temperature-sensitive element configured to change resistance upon a change in temperature configured to control a current to the heating element. In one or more embodiments, the temperature-sensitive element is configured to deliver an input when the temperature-sensitive element has been heated to a threshold temperature. In one or more embodiments, the one or more electrically conductive paths further includes a heater power circuit configured to deliver power to the logic control circuit. In one or more embodiments, the one or more electrically conductive paths further includes an operational power circuit configured to switch off power to the heater power circuit and switch on power to the operational power circuit upon a delivery of the input from the logic control circuit.

In some embodiments of the circuit board, the substrate is configured to be at least one of a printed circuit board, a printed wiring board, or a flexible circuit.

In some embodiments of the circuit board, the heating element is at least one of a stripline, a microstrip, a copper trace, or a foil heater.

In some embodiments of the circuit board, the temperature-sensitive element is configured as a Wheatstone bridge.

In some embodiments of the circuit board, the temperature-sensitive element is configured as a resistance temperature detector.

In some embodiments of the circuit board, the operational power circuit is powered by a primary direct current rail.

In some embodiments of the circuit board a current through the heating element is controlled by an N-channel field-effect transistor.

In some embodiments of the circuit board, the heating element is configured to heat the portion of the circuit board from a temperature less than −55° C. to a temperature equal to or greater than −55° C.

In some embodiments of the circuit board, the heating element is configured to heat the portion of the circuit board from a temperature less than −40° C. to a temperature equal to or greater than −40° C.

In some embodiments of the circuit board, the heating element is configured to heat the portion of the circuit board from a temperature less than 0° C. to a temperature equal to or greater than 0° C.

In some embodiments of the circuit board, the heating element is configured to have a serpentine path.

In some embodiments of the circuit board, the logic control circuit is configured as a passive logic circuit.

In some embodiments of the circuit board, the logic control circuit further comprises at least one of a comparator or a differential amplifier.

In some embodiments of the circuit board, the operational power circuit further comprises a P-channel field-effect transistor.

In some embodiments of the circuit board, the one or more electrically conductive paths further comprises one or more integrated circuits configured to perform a function for at least one of the logic control circuit, the heater power circuit, or the operational power circuit.

In some embodiments of the circuit board, the circuit board is configured for use on equipment operating in a polar region and/or an aircraft.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
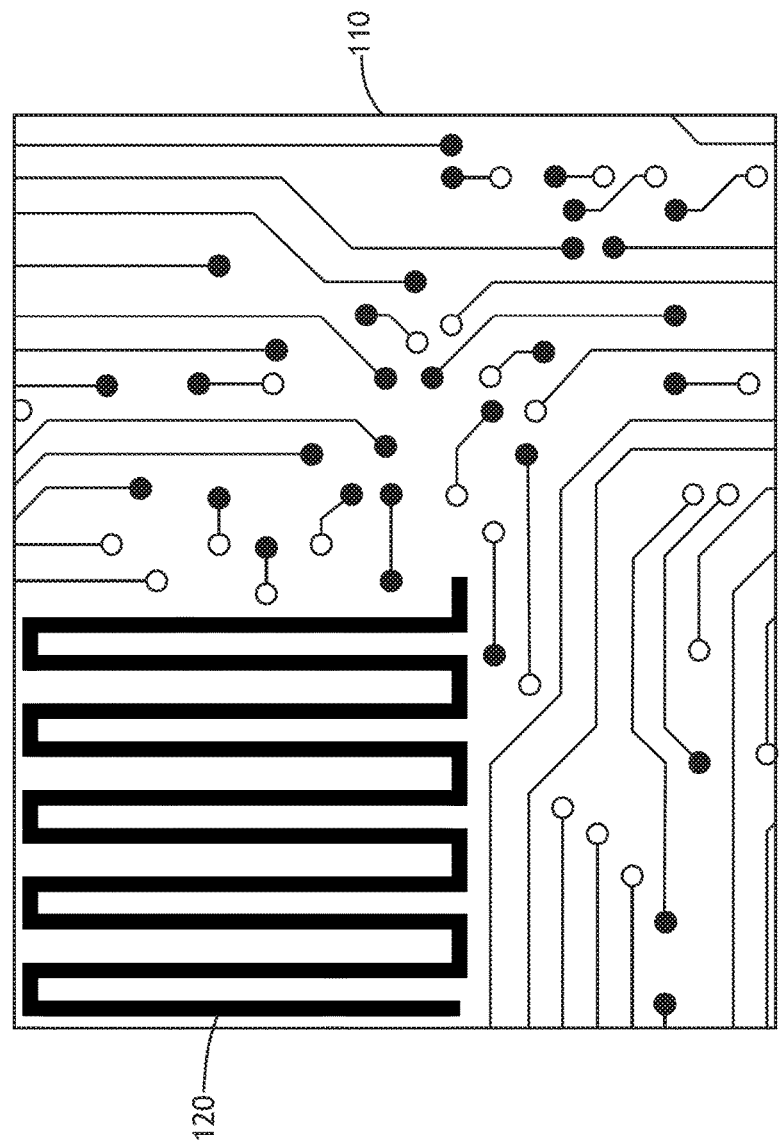
FIG. 1 illustrates an example environment of a circuit board heater, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

A heater for electronic components is disclosed. In particular, a heater for electronic components is disclosed, wherein a heating element and at least a portion of control elements for the heater are incorporated into the substrate that the electronic components reside. The heater is configured to keep the electronic components at a standard working temperature (e.g., at least −40° C. for many industrial electronic components and at least 0° C. for many commercial components).

FIG. 1 illustrates an example environment 100 of a circuit board heater, in accordance with one or more embodiments of the present disclosure. The example environment 100 includes a circuit board 110 (e.g., a substrate). The circuit board may be a circuit board known in the art including but not limited to a printed circuit board (PCB), printed wiring board (PWB), a flexible circuit board, a breadboard, or a stripboard. For example, the circuit board may be a single-sides PCB. The circuit board may contain any electric componentry known in the art, including but not limited to traces, processors (e.g., field-programmable gate arrays (FPGAs) or application-specific integrated circuits (ASICs), capacitors, resistors, and the like. It should be known that the electronic componentry embedded within the circuit board 110 may contain both electric componentry for the circuit board heater and electric componentry unrelated to the circuit board heater.

In some embodiments, the circuit board heater includes a heating element 120 disposed upon or embedded into the circuit board 110. The heating element 120 is an electrically conductive elements that produces heat when an electric current flows through the path of the heating element 120. The heating element 120 may be any element or electrically conductive path known in the art including but not limited to a stripline, a microstrip, a copper trace, or a foil heater circuit. For example, the heating element 120 may be a copper stripline.

The configuration of the heating element 120 on the circuit board 110 may be any configuration that allows the heating portion to heat at least a portion of the circuit board 110 including but not limited to a circular spiral pattern, a square spiral pattern, a helical pattern, a straight line, or a serpentine pattern. For example, in some embodiments, the heating element is configured to have a serpentine path. For instance, the heating element 120 may be configured as a serpentine configuration within an overall shape of a square, as in FIG. 1. In another example, the heating element 120 maybe laid in a trace throughout the circuit board. In another example, the heating element may be embedded within one or more layers of a multi-layered circuit board. Many different configurations of the heating element 120 are possible. Therefore, the above description should not be interpreted as a limitation of the present disclosure, but merely an illustration.

The heating element 120 operates through electrical resistance heating. In general, this resistance is equivalent to the power of the heating element 120 divided by the square of the current of the heating element 120, $R=P/V^2$, where R is resistance in ohms, P is power in watts, and V is voltage in volts. The resistance of a stripline can be seen in the equation $R=\rho(L/1.37TW)[1+\alpha(\text{temp}-25)]$, where $\rho$ is the resistivity (e.g., 669.3 ohm-mm), a is the temperature coefficient (e.g., $3.9\times10^{-3}$ $\Omega^2/°$ C.), L is length in mm, W is the width of the metal path (e.g., trace) in mm, and T is copper thicken in ounces. From this equation, the size of the heating element 120 (e.g., length, thickness, and width) and the characteristics of the input required to heat the heating element 120 can be determined.

Figure 2:
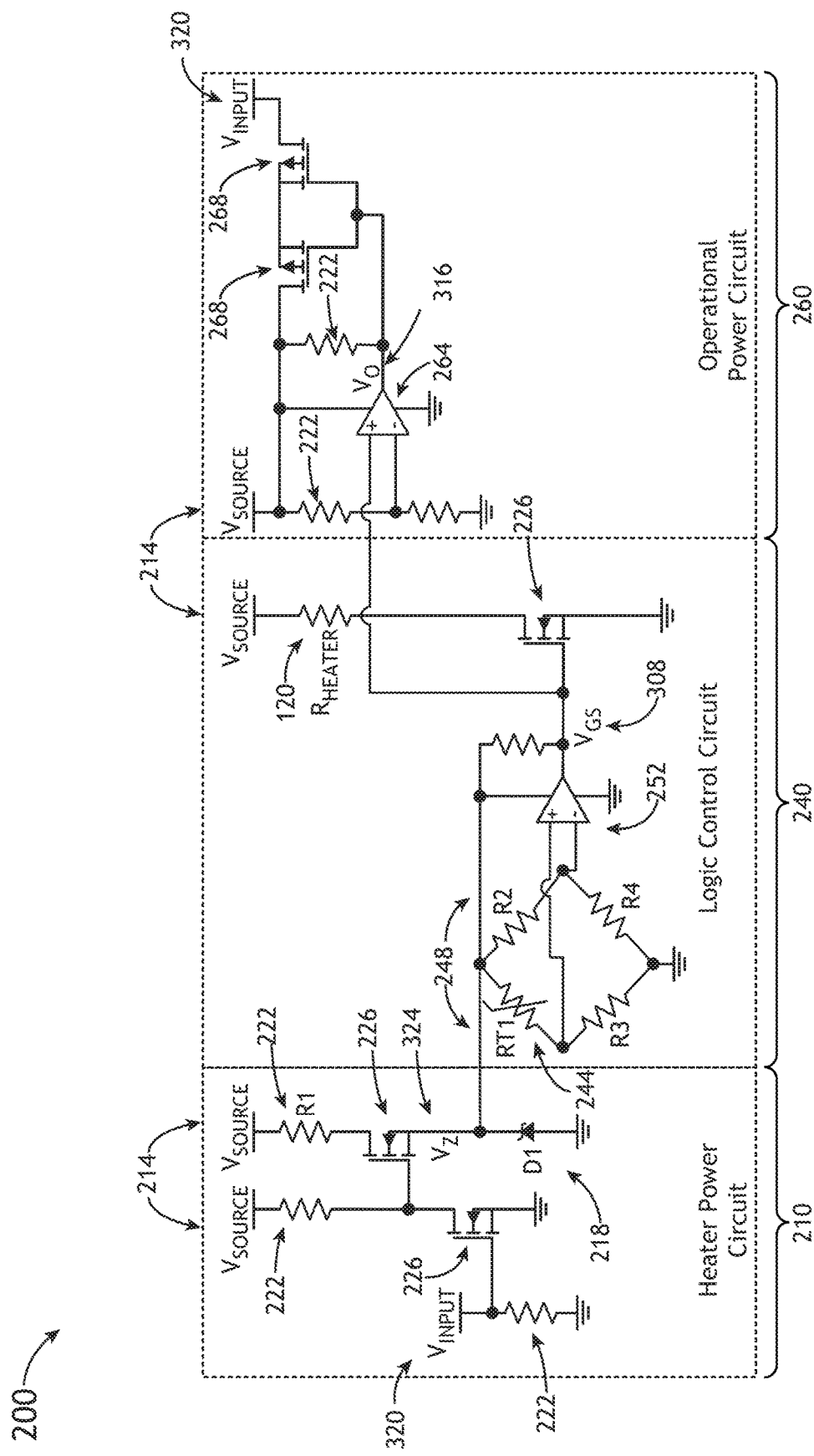
FIG. 2 illustrates a schematic drawing of the heater circuitry (e.g., electrically conductive path) for the circuit board, in accordance with one or more embodiments of the disclosure.

FIG. 2 illustrates a schematic drawing of the heater circuitry 200 (e.g., electrically conductive path) for the circuit board 110, in accordance with one or more embodiments of the disclosure. The heater circuitry 200 can generally be divided into three segments for purposes of description. In some embodiments, the heater circuitry 200 includes a heater power circuit 210. The heater power circuit 210 provides power to the logic control circuit 240. The heater power circuit 210 may also be switched off when the heating element reaches a threshold temperature (e.g., −55° C., −40° C., 0° C., or some other specified temperature) and the operational circuit 260 is turned on.

In some embodiments, the heating element 120 is configured to heat a portion of the circuit board from a temperature less than the minimal operating temperature (e.g., based on the manufacturer's minimal operating temperature for the components in the operational circuitry) to a temperature equal to or greater than the minimal operating temperature (e.g., again, based on the manufacturer's minimal operating temperature for the components in the operational circuitry). For instance, in some embodiments, the heating element is configured to heat a portion of the circuit board from a temperature less than −55° C. to a temperature equal to or greater than −55° C. In another instance, the heating element is configured to heat a portion of the circuit board from a temperature less than −40° C. to a temperature equal to or greater than −40° C. In still another instance, the heating element is configured to heat a portion of the circuit board from a temperature less than 0° C. to a temperature equal to or greater than 0° C. Likewise, in some embodiments, the threshold temperature of the circuit board may be based on a manufacturer's minimal operating temperature for the components in the operational circuitry. For instance, in some embodiments, the threshold temperature may be −55° C. In another instance, the threshold temperature may be −40° C. In still another instance, the threshold temperature may be 0° C. It should be known that any temperature may be a threshold temperature for the circuit board 120. Therefore, the above description should not be interpreted as a limitation of the present disclosure, but merely as an illustration.

In some embodiments, the source power 214 (e.g., $V_{source}$) to the heater power circuit 200 is the primary DC-rail delivered from the platform (e.g., the power comes from the same power source as what powers the rest of the circuit board 110). The heater power source further includes a Zener diode 218. A Zener diode 218 is an electronic with a doped p-n junction that allows current flow from anode to cathode when the anode is positive with respect to the cathode. When the voltage across the terminal is reversed and the voltage potential reaches a specified Zener voltage threshold, the junction breaks down and the current will then flow in the reverse direction. Within this disclosure, the Zener diode acts as a voltage regulator for the components that control the heating element 120, allowing for controlled voltage to the logic control circuit 240 regardless of magnitude of source power 214.

In some embodiments, the heater power circuit 210 includes one or more resistors 222 that act to implement resistance to the heater power circuit. The resistors 222 may be any resistor 220 known in the art and each resistor 222 may have a specified characteristic. For example, the resistor 222 designated as R1 is specified to deliver power necessary power to the logical components of the heater power circuit 210, but also to limit current through the Zener diode.

In some embodiments, the heater power circuit 210 includes one or more an N-channel field-effect transistors (N-FET 226). N-FETs 226 are a type of transistor which uses an electric field to control the flow of current. In particular, the resistance in an N-FET 226 increases in the presence of a negative gate-to-source voltage, causing the N-FET 226 to switch off. Therefore, the N-FET 226 allows the heater power circuit 210 to switch off power to the heater element 120.

In some embodiments, heater circuitry includes a logic control circuit 240. The logic control circuit 240 is electrically coupled to the heater power circuit 210. In some embodiments, the logic control circuit 240 is a passive logic circuit that controls the current through the heating element 120. In some embodiments logic control circuit 240 includes the heater element 120. In some embodiments, the logic control circuit 240 includes a temperature-sensitive element 244 (e.g., resistor whose resistance is dependent on temperature). The temperature-sensitive element 244 may be any temperature-sensitive element 244 known in the art. For example, the temperature-sensitive element 244 is configured as a thermistor. In another example, in some embodiments the temperature-sensitive element is configured as a resistance temperature detector. In some embodiments, the thermistor (e.g., the temperature-sensitive element 244) is configured within a Wheatstone bridge 248. A Wheatstone bridge 248 is a square of four resistors 222 bisected by a galvanometer into two halves, one half containing two resistors (e.g., R3 and R4 in FIG. 1) and the other half containing a thermistor (e.g., RT) and a fourth resistor, R2, whose resistance may be selected depending on the temperature threshold to be set for the circuit board heater, and the desired signal output from the galvanometer For example, if the desired output of the galvanometer is zero volts, and if the relationship between the balances halves of the Wheatstone bridge 248 is R3/R4=RT/R2, and if the resistors R3 and R4 are equivalent, then R3/R4=1, 1=RT/R2, and RT=R2. Therefore, the resistor R2 can be selected based on the resistance equal to the resistance of the thermistor at a specific temperature, for which the galvanometer will be balanced (e.g., zero voltage).

The thermistor can be any thermistor known in the art. For instance, the thermistor may be a temperature dependent platinum thin film chip resistor PTS120601 B1K00P100 (PTS) from Vishay/Beyschlag. For instance, at −55° C., the PTS thermistor will have a resistance of 783.19 ohms. Therefore, to produce a balanced galvanometer at −55° C., the R2 resistor will have a resistance of approximately 783.18 ohms. In another instance, −40° C., the PTS thermistor will have a resistance of 842.71 ohms. Therefore, to produce a balanced galvanometer at −40° C., the R2 resistor will have a resistance of approximately 842.71 ohms. It should be known that any output from the galvanometer may be used as an output signal within the logic control circuit 240. It should also be known than any configuration of resistors known in the art may be used for the construction of the Wheatstone bridge 248 within the logic control circuit 240. Therefore, the above description should not be interpreted as a limitation of the present disclosure, but merely as a limitation.

In some embodiments, the logic control circuit further includes a comparator 252 or a differential amplifier that receives the signals from the galvanometer of the Wheatstone bridge 138. The comparator is a device compares two voltages, and outputs a digital signal indicating which voltage is larger. The comparator 252 may be any comparator 252 known in the art. For example, the comparator 2525 may be a comparator with a single-channel and an open-drain output (e.g., TLV7041 from Texas instruments). The comparator would be used in an environment where the operational circuitry on the rest of the circuit board 110 would create enough heat to main high-enough temperatures (e.g., greater than −40° C.) and allow the heater element 120 to be permanently shut off to save power. In some embodiments, the current through the heating element 120 is controlled by an N-FET 226 The N-FET 226 itself is controlled by the upstream componentry (e.g., the temperature-sensitive element 244 and/or the comparator 252.)

In some embodiments, a digital amplifier is used in place of the comparator 252. For example, the digital amplifier may be used in a low-power design for a circuit board that is not able to maintain a high-enough temperature when in use. For instance, the digital amplifier may be used to continuously monitor the circuit and apply a voltage in the linear region of an N-FET 226 within the logic control circuit 240. In this instance, the heater power circuit 210 would either be disabled or replaced with only a resistor 214 (e.g., the resistor R1) tied to the source voltage 214 and zener diode 218 (e.g., at D1).

In some embodiments, the heater circuitry 200 further includes an operational power circuit 260. The operational power circuit 260 supplies power to the operational electronic componentry on the circuit board 110 (e.g., the electronic componentry other than the circuitry of the heater power circuit 210 and the logic control circuit 240). In some embodiments, the operational power circuit 260 is powered by a primary direct current rail.

In some embodiments, the operational power circuit 260 receives an input from the either the comparator 252 or the differential amplifier, and compares the input to a fixed set voltage through an operational power circuit comparator 252 within the operational power circuit 260, which controls whether the operational power circuit is switched on to deliver power to the electronic components of the circuit board 110. By way of example, if the voltage from the comparator 252 of the logic control circuit drops to zero volts, the current will be sent through the heating element 120. In some embodiments, the operational power circuit further includes a P-channel field-effect transistor (e.g., P-channel FET 268). As from the previous example, a zero-voltage signal also indicates to the operational power circuit to 'turn on' one or more P-channel FETs 268 that control power to the operational power circuit 260. The power to the operational power circuit 260 is then routed back to the heater power circuit to the heater power circuit 210, which then turns the power off to the heating element 120.

In some embodiments, one or more of the electrically conductive paths further includes one or more integrated circuits configured to perform a function for at least one of the logic control circuit 240 the heater power circuit 210, or the operational power circuit 260. For example, an integrated circuit may be configured to perform one or more functions of the heater power circuit 210 (e.g., an integrated circuit containing a metal-oxide semiconductor field-effect transistor (MOSFET) acting as the N-FET 226). In another example, an integrated circuit may be configured to perform one or more functions of the logic control circuit 240 (e.g., an integrated circuit containing a comparator 264). In another example, an integrated circuit may be configured to perform one or more functions of the operational control circuit 260 (e.g., an integrated circuit containing a comparator 264). An integrated circuit may contain componentry for any one of the circuits (e.g., logic control circuit 240, heater power circuit 210, or operational power circuit 26), a combination of any two of the circuits, or all three circuits. Therefore, the above description should not be interpreted as a limitation of the present disclosure, but merely as an illustration.

Figure 3:
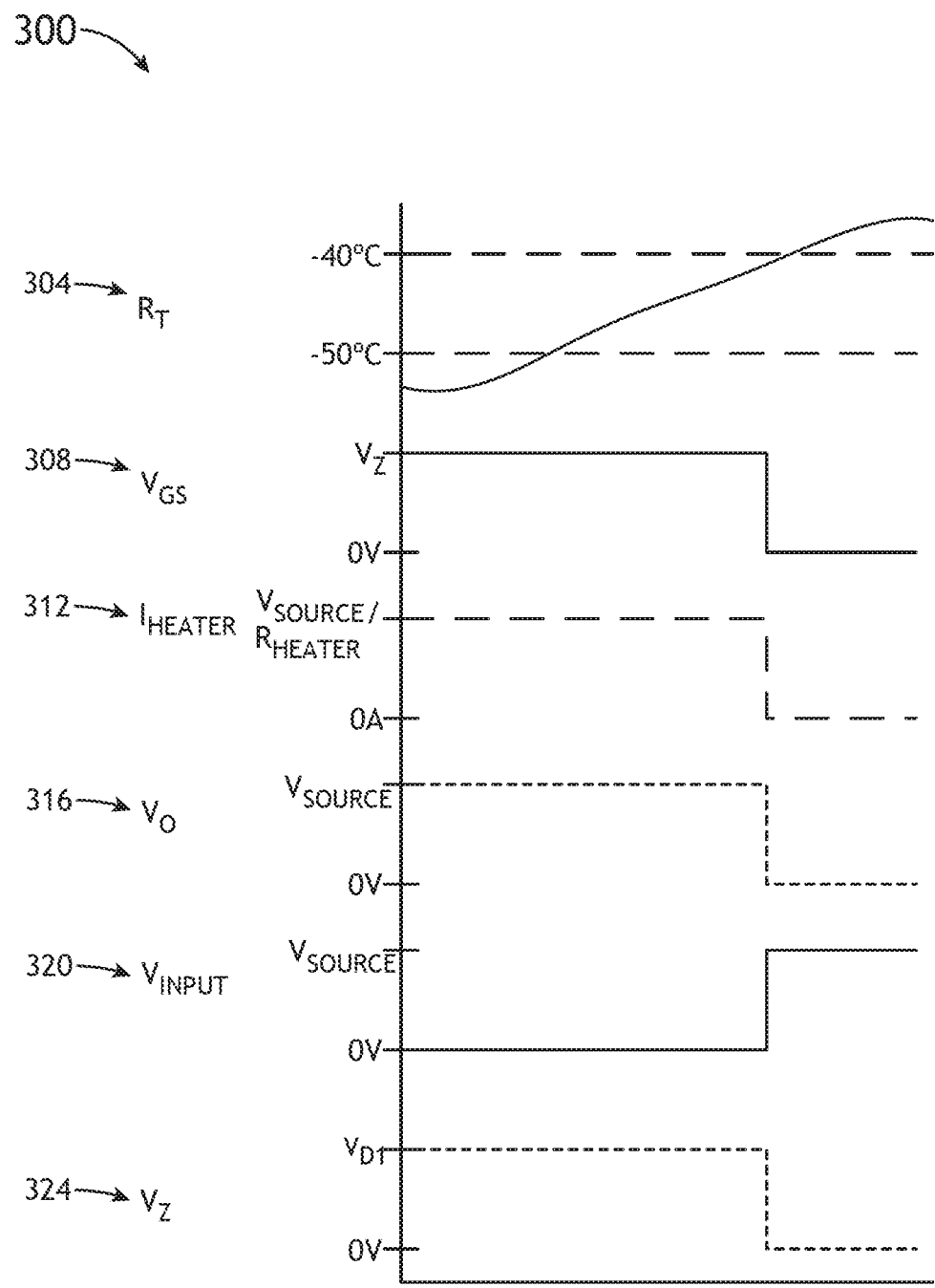
FIG. 3 is a graph illustrating the change in voltage at several locations within the heater circuitry during a change in temperature, in one or more embodiments of the disclosure.

FIG. 3 is a graph illustrating the change in voltage at several locations within the heater circuitry 200 during a change in temperature, in one or more embodiments of the disclosure. In this graph, the temperature 304 of the temperature-sensitive element 244 (e.g., RT) ranges from below −50° C. to above the threshold temperature of −40° C. For example, when the temperature has reached threshold, and the Wheatstone bridge is designed to be balanced when the threshold temperature is reached, the voltage between the comparator and the N-FET 226 of the logic control circuit 240 (e.g., the gate-to-source voltage VGS 308) falls from a value greater than zero volts to a value of zero. At the same time, the current running through the heating element (e.g., $I_{HEATER}$ 312) falls from a value greater than zero amps to a value of zero amps. Again, at the same time, the voltage at the output of the comparator 264 (e.g., $V_O$ 316) falls from a value greater than zero volts to a value of zero volts.

Using the same example (e.g., when the Wheatstone bridge 248 is balanced), the input voltage at the operational power circuit 260 (e.g., $V_{INPUT}$ 320) rises from a value of zero volts to a value above zero volts (i.e., the operation power circuit 260 becomes switched on. At the same time the Zener voltage (e.g., $V_z$ 324) at the Zener diode falls from a value above zero volts to a value of zero volts.

Figure 4:
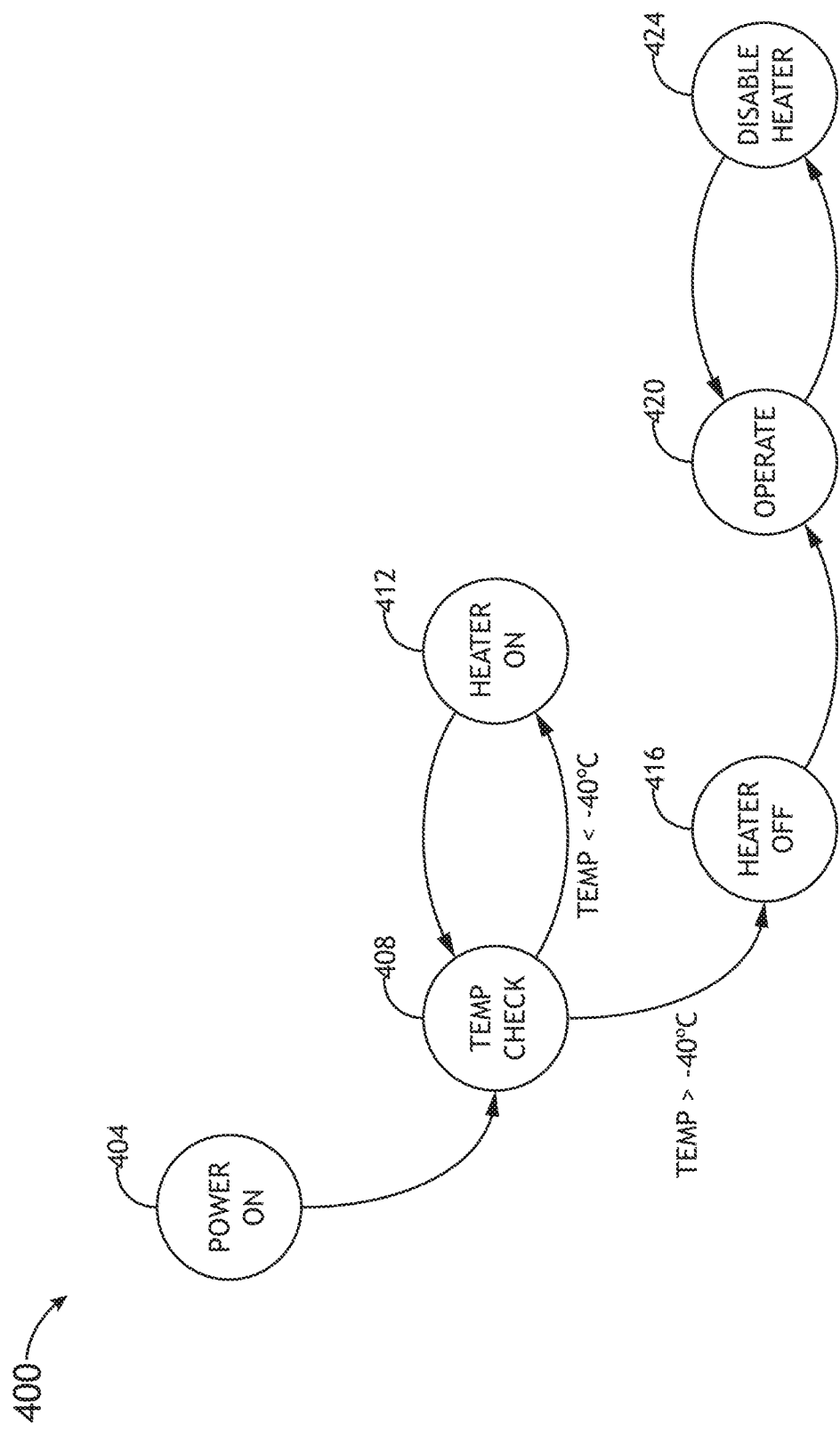
FIG. 4 illustrates a flow diagram describing the operational steps of the circuit board heater, in one or more embodiments of the disclosure.

FIG. 4 illustrates a flow diagram 400 describing the operational steps of the circuit board heater, in one or more embodiments of the disclosure. In one step 404, the power for the circuit board is turned on (e.g., "power on" as in FIG. 4). For example, turning on the power to the circuit board also turns on the power to the heater power circuit 210. In another step 408, the temperature of the circuit board is checked (e.g., "temp check" as in FIG. 4). For example, the output voltage of the galvanometer of the Wheatstone bridge is checked to see whether the resistance of the thermistor (e.g., the temperature-sensitive element 244) has reached across a threshold value. If the circuit board heater has determined that the temperature of the thermistor is below the threshold value (e.g., less than −40° C., then the step 412 of turning the heater on will be performed (e.g., "heater on" as in FIG. 4). For example, the heating element 120 will be turned on. At this time, the circuit board heater may vacillate between steps 408 of checking the temperature and step 412 of turning on the heater (e.g., or keeping on the heater) until the thermistor reaches the threshold temperature.

If the thermistor reaches the threshold temperature, the circuit board heater will perform the step 416 of turning the heater off (e.g., "heater off" as in FIG. 4"). For example, the comparator may send an input to an N-FET of the logical control circuit 240, compelling the N-FET to switch off power to the heating element 120. At nearly the same time, the circuit board heater performs the step 420 of turning on the operational power circuit 260 (e.g., "operate" as in FIG. 4). For example, the comparator 264 for the operational power circuit 260 may compare the signal from the comparator 252 from the logical control circuit 240 with a fixed set voltage, then upon detecting the appropriate value, turn on the P-channel FETs 268 that control power to the operational power circuit. One the operational power circuit 260 is turned on, the operation power circuit 260 may perform the step 424 of disabling the heater power circuit (e.g., "disable heater" as in FIG. 4)

In some embodiments, the circuit board 110 is configured for use on an aircraft. For example, the circuit board 110 may be used in a high-altitude aircraft, where temperatures routinely drop to temperatures of −40° C. or colder. In some embodiments, the circuit board 110 is configured for use of equipment operating in a polar region. For example, the circuit board may be used in a transmitter located at a base station on the arctic circle, where temperatures routinely drop to temperatures of −40° C. or colder. Other implementations of the circuit board 110 for uses in a cold environment are possible.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A circuit board comprising:
a substrate; and
one or more electrically conductive paths embedded in the substrate, comprising:
  a logic control circuit that is embedded in the substrate, comprising:
    a heating element, configured to heat a portion of the circuit board; and
    a temperature-sensitive element configured to change resistance upon a change in temperature and control a current to the heating element, wherein the logic control circuit is configured to deliver an input when the temperature-sensitive element has been heated to a threshold temperature;
  a heater power circuit that is embedded in the substrate and configured to deliver power to the logic control circuit; and
  an operational power circuit that is embedded in the substrate and configured to switch off power to the heater power circuit and switch on power to the operational power circuit upon a delivery of the input from the logic control circuit, wherein the logic control circuit further comprises at least one of a comparator or a differential amplifier, wherein the operational power circuit further comprises a P-channel field-effect transistor, wherein an output of the at least one of the comparator or the differential amplifier is connected to an input of a N-channel field-effect transistor, wherein a current through the heating element is controlled by the N-channel field-effect transistor,
wherein the logic control circuit is configured as a passive logic circuit.

2. The circuit board of claim 1, wherein the substrate is configured of at least one of a printed circuit board, a printed wiring board, or a flexible circuit.

3. The circuit board of claim 1, wherein the heating element is configured of at least one of a stripline, a microstrip, a copper trace, or a foil heater.

4. The circuit board of claim 1, wherein the temperature-sensitive element is configured as at least one of a Wheatstone bridge or a resistance temperature detector.

5. The circuit board of claim 1, wherein the operational power circuit is powered by a primary direct current rail.

6. The circuit board of claim 1, wherein the heating element is configured to heat the portion of the circuit board from a temperature less than −55° C. to a temperature equal to or greater than −55° C.

7. The circuit board of claim 1, wherein the heating element is configured to heat the portion of the circuit board from a temperature less than −40° C. to a temperature equal to or greater than −40° C.

8. The circuit board of claim 1, wherein the heating element is configured to heat the portion of the circuit board from a temperature less than 0° C. to a temperature equal to or greater than 0° C.

9. The circuit board of claim 1, wherein the heating element is configured to have a serpentine path.

10. The circuit board of claim 1, wherein the one or more electrically conductive paths further comprises one or more integrated circuits configured to perform a function for at least one of the logic control circuit, the heater power circuit, or the operational power circuit.

11. The circuit board of claim 1, wherein the circuit board is configured for use on at least one of equipment operating in a polar region or an aircraft.

* * * * *